United States Patent [19]

Glica et al.

[11] Patent Number: 5,142,244
[45] Date of Patent: Aug. 25, 1992

[54] FULL RANGE INPUT/OUTPUT COMPARATOR

[75] Inventors: Stephen J. Glica, Somerset; John A. Olmstead, Cape May Court House, both of N.J.

[73] Assignee: Harris Corporation, Melbourne, Fla.

[21] Appl. No.: 696,481

[22] Filed: May 6, 1991

[51] Int. Cl.$^5$ .............................................. H03F 3/45
[52] U.S. Cl. ..................................... 330/253; 307/494
[58] Field of Search ................ 307/445, 494, 497; 330/253, 257, 277, 295

[56] References Cited

U.S. PATENT DOCUMENTS

| | | | |
|---|---|---|---|
| 4,585,961 | 4/1986 | Daubert | 330/253 X |
| 4,825,100 | 4/1989 | Caspell | 307/494 X |
| 4,859,872 | 8/1989 | Hyakutake | 307/494 X |
| 4,859,961 | 8/1989 | Davenport | 330/295 X |

Primary Examiner—Steven Mottola
Attorney, Agent, or Firm—Henry I. Schanzer

[57] ABSTRACT

A comparator circuit includes first and second differential amplifier input stages to which are applied the same differential input signals with each stage being powered by first (V1) and second (V2) operating potentials. The first stage is only responsive to differential input signals ranging in value between V1 and a first state threshold voltage ($V_{T1}$) above V2. The second state is only responsive to differential input signals ranging in value between V2 and a second state threshold ($V_{T2}$) below V1. Each one of the first and second stages, when operative, produces output signals which can swing fully between V1 and V2 as a function of the input signals. The output signals of the first and second stages are combined in an OR'ing circuit to produce an output signal whose amplitude can swing over the full operating voltage applied to the first and second supply lines for values of differential input signals ranging between V1 and V2.

9 Claims, 2 Drawing Sheets

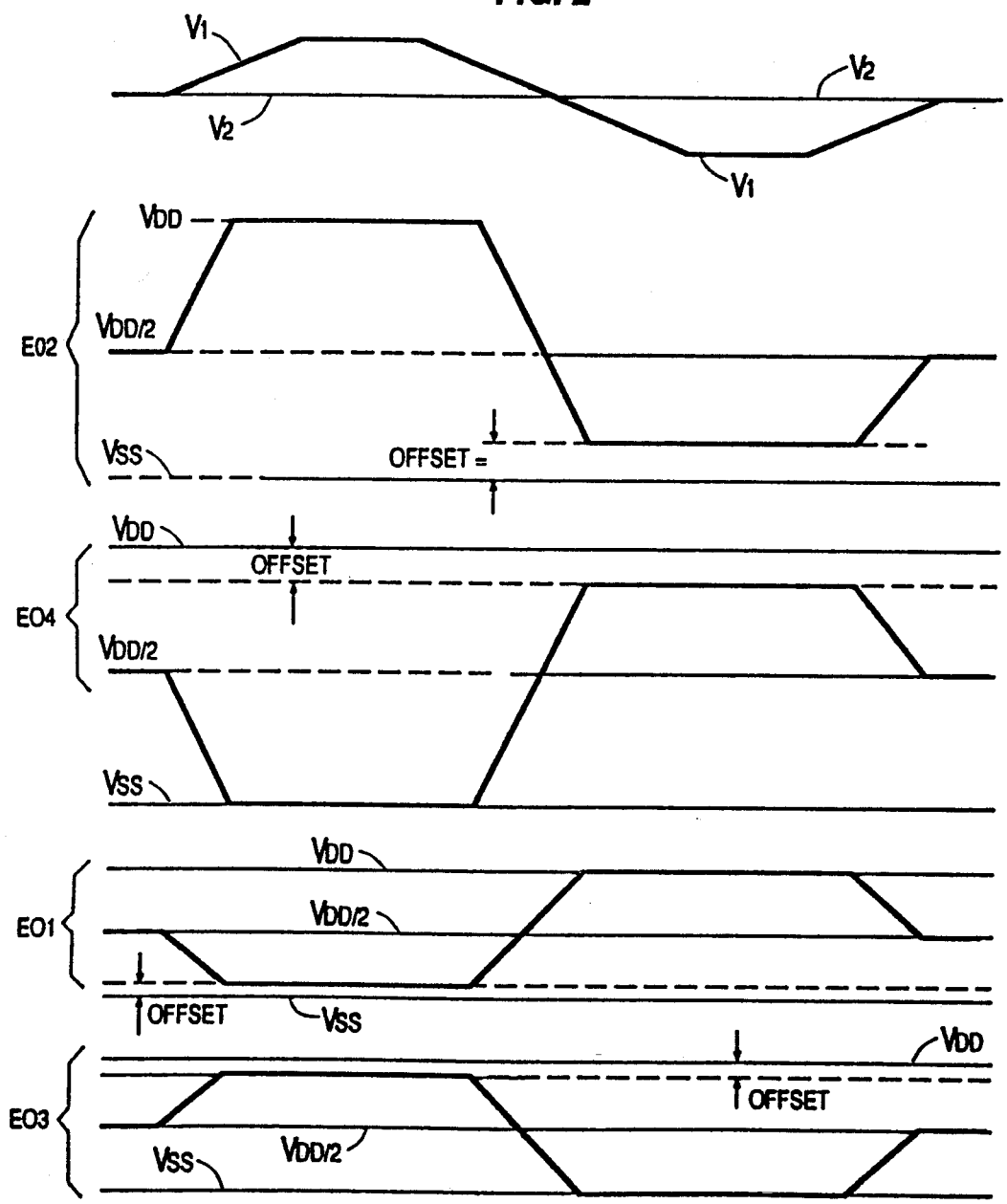

FULL RANGE INPUT/OUTPUT COMPARATOR

BACKGROUND OF THE INVENTION

This invention relates to a comparator circuit and, in particular, to a comparator circuit which is responsive to differential input signals ranging over the full operating potential (i.e. from rail to rail) and which is capable of producing output signals which can swing from rail to rail (i.e. over the full range of the operating potential applied to the comparator circuit).

A circuit designed to respond to differential input signals ranging over the full operating potential aplied to the circuit is shown, for example, in U.S. Pat. No. 4,377,789 titled "Operational Amplifier Employing Complementary Field-Effect Transistors" issued to M.V. Hoover. However, the output of the circuit in the Hoover (4,37,789) patent does not swing from rail-to-rail (i.e. from $V_{DD}$ to $V_{SS}$). In fact, the output is limited to a value of $V_{DD}$ minus the threshhold voltage of a P-type transistor and to a value of $V_{SS}$ plus the threshhold voltage of an N-type transistor. The inability to produce output signals which swing all the way to $V_{DD}$ or $V_{SS}$ is problematic. For example, such an output can not drive a subsequent CMOS logic circuit properly, resulting in unwanted and undesirable power dissipation.

Another circuit designed to respond to differential input signals ranging from rail-to-rail is shown in U.S. Pat. No. 4,333,058 titled "Operational Amplifier Employing Complimentary Field-Effect Transistors" and also issued to M.V. Hoover. The U.S. Pat. No. 4,333,058 reference includes a first differential amplifier stage (10) comprised of differentially connected transistors (P1, P2) and N-type load transistors (N3, N4) driving a current sinking transistor (N5) and a second differential amplifier stage (30) comprised of differentially connected N-type transistors (N1, N2) and P-type load transistors (P3, P4) driving a current sourcing transistor (P5). The same differential input signals are applied to the two differential amplifier stages (10 and 30).

When the differential signals are within a P-threshhold voltage ($V_{TP}$) of the most positive operating voltage ($V+$), the first differential amplifier stage (10) is inoperative in that both P1 and P2 are turned-off. Current sinking transistor N5 is then either off or in an indeterminate state. Concurrently, the second differential amplifier stage 30 is operative driving current sourcing transistor P5 as function of the differential input signal. However, since N5 is off or indeterminate, the output response of the amplifier is not a true or linear function of the differential input signal.

In a similar manner, when the differential input signals are within an N-threshhold voltage ($V_{TN}$) of the lowest operating voltage ($V-$), the second differential amplifier stage (30) is inoperative in that both N1 and N2 are turned-off. Current sourcing transistor P5 is then off or in an indeterminate state. Concurrently, the first differential amplifier stage (10) is operative driving the current sinking transistor N5 as a function of the input signal. However, since P5 is off or indeterminate, the output response of the amplifier is not a true or linear function of the differential input signal.

The problems discussed above are overcome in circuits embodying the invention.

SUMMARY OF THE INVENTION

A comparator circuit embodying the invention includes first and second differential amplifier input stages to which are applied the same differential input signals and which are operatively connected between first and second supply lines to which are respectively applied first (V1) and second (V2) operating potentials. The first stage is only responsive to differential input signals ranging in value between V1 and a first stage threshold voltage ($V_{T1}$) above V2. The second stage is only responsive to differential input signals ranging in value between V2 and a second stage threshold ($V_{T2}$) below V1. Each one of the first and second stages, when operative, produces output signals which can swing fully between V1 and V2 as a function of the input signals. The output signals of the first and second stages are combined in an OR'ing circuit to produce an output signal whose amplitude can swing over the full operating voltage applied to the first and second supply lines for values of differential input signals ranging between V1 and V2.

BRIEF DESCRIPTION OF THE DRAWING

In the accompanying drawing like reference characters denote like components; FIG. 2 is a waveform diagram of voltages produced at various points of the circuit of FIG. 1.

DETAILED DESCRIPTION OF THE INVENTION

Figure 1:
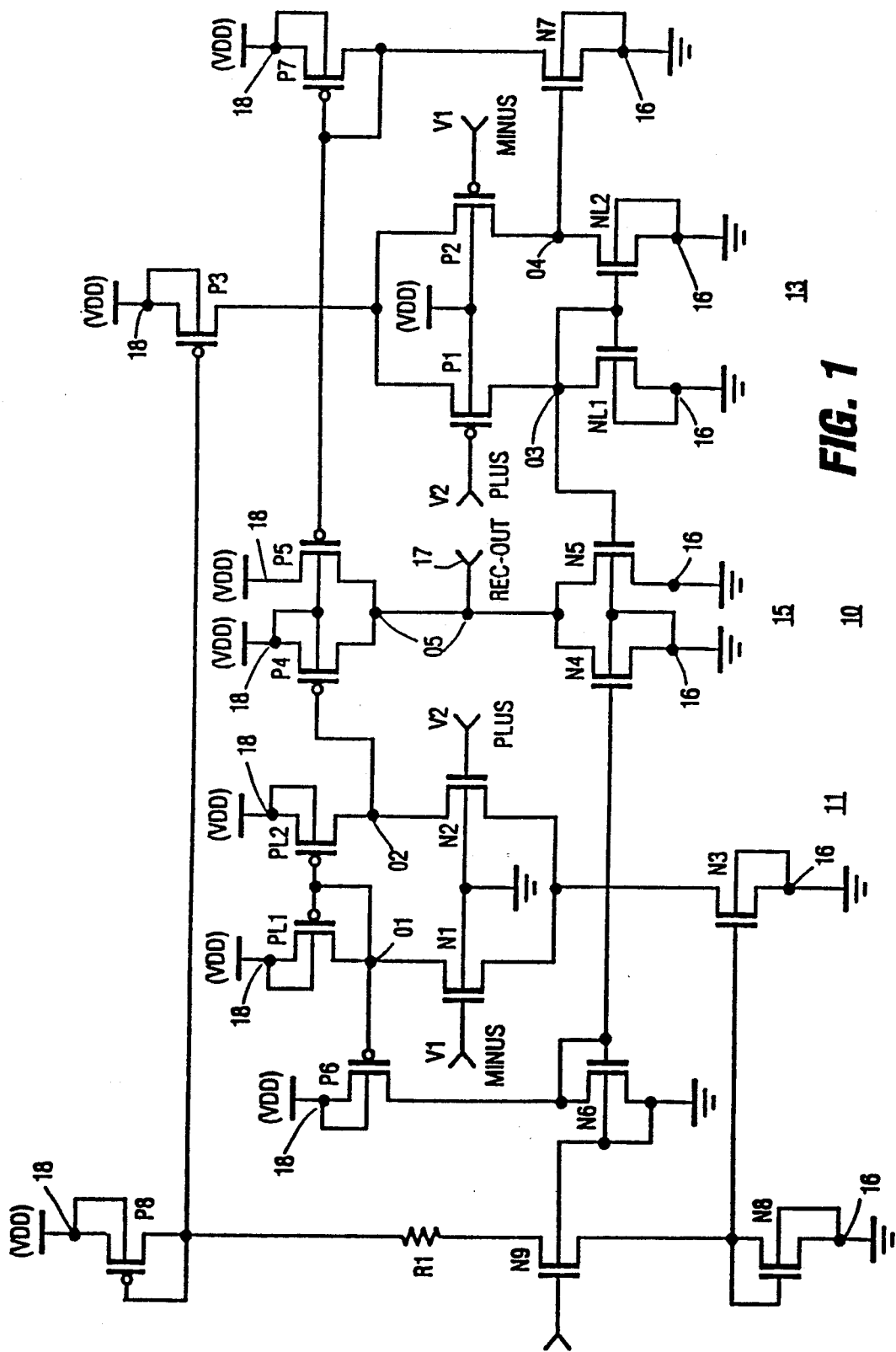
FIG. 1 is a schematic diagram of a comparator circuit embodying the invention.

Insulated-gate field-effect transistors (IGFETs) are the active devices preferred for use in practicing the invention. For this reason, the circuit is illustrated in the drawing as employing such transistors and will be so described hereinafter. However, this is not intended to preclude the use of other suitable devices and to this end, the term "transistor" when used without limitation in the appended claims, is used in a generic sense.

In the FIGURES, enhancement type IGFETs of P conductivity type are identified by the letter P followed by a particular reference character; and enhancement type IGFETs of N-conductivity type are identified by the letter N followed by a particular reference character. The characteristics of IGFETs are well known and need not be described in detail. But, for a clearer understanding of the description to follow, definition and characteristics of IGFETs pertinent to the invention are set forth below.

1. IGFETs have a first electrode and a second electrode referred to as the source and drain defining the ends of a conduction path, and a control electrode (gate) whose applied potential determines the conductivity of the conduction path. For a P-type IGFET the source electrode is defined as that electrode o the first and second electrodes having the highest potential applied thereto. For an N-type IGFET, the source electrode is defined as that electrode of the first and second electrodes having the lowest potential applied thereto.

2. The devices used are bidirectional in the sense that when an enabling signal is applied to the control electrode, current can flow in either direction in the conduction path defined by the first and second electrodes 3. For conduction to occur, the applied gate-to-source potential (Vgs) must be in a direction to forward bias the gate with respect to the source and must be greater in magnitude than a given value which is defined as the threshold voltage (Vt). Thus, where the applied Vgs is in a direction to forward bias the transistor but is lower in amplitude than Vt the transistor remains cut off and there is substantially no current flow in the conduction channel.

4. When used as a source follower, the voltage at the source electrode (Vs) "follows" the signal applied at the gate (Vg) but is offset with respect to the gate by a voltage whose amplitude is equal to the threshold voltage (Vt) of the device (Vs=Vg−Vt).

Referring to FIG. 1 there is shown a first and second complementary differential amplifier stages 11 and 13, respectively, whose outputs are coupled to an OR'ing circuit 15 for producing an output signal 05 at output terminal 17 which can swing virtually over the full operating voltages (Vdd and Vss) applied to amplifier stages 11 and 13.

The first differential amplifier stage 11 includes IGFETS N1 and N2 having their source electrodes connected in common to the drain of an IGFET N3 which is biased to function as a relatively constant current source. The source of N3 is connected to power terminal 16 to which is applied the most negative potential, Vss, which in the FIGURE is set to ground potential. Input signals V1 and V2 are applied to the gate electrodes of N1 and N2, respectively. The drains of N1 and N2 are connected to output nodes 01 and 02, respectively. Two P-type transistors, PL1 and PL2, which function as load devices have their conduction paths connected between a power terminal 18 and terminal 01 and 02, respectively. The most positive operating potential denoted as Vdd is applied to terminal 18. The gates of PL1 and PL2 are connected in common to the drains of PL1 and N1 at output terminal 01.

The second differential amplifier stage 13 includes IGFETs P1 and P2 having their source electrodes connected in common to the drain of P3 which is biased to function as a relatively constant current source. The source of P3 is connected to Vdd. The input signals V1 and V2 are applied to the gate electrodes of P2 and P1, respectively. The drains of P1 and P2 are respectively connected to output nodes 03 and 04. Two N-type transistors, NL1 and NL2, which function as load devices, have their conduction paths connected between terminal 16 and output terminals 03 and 04, respectively. The gates of NL1 and NL2 are connected in common to the drains of P1 and NL1 at output 03.

The OR'ing circuit 15 includes IGFETS N4 and P4 respectively driven from the outputs 01 and 02 of stage 11 and IGFETS N5 and P5 respectively driven from the outputs 03 and 04 of stage 13.

The output 01 is connected to the gate of P6 whose source is connected to Vdd. The drain of P6 is connected to the drain and gate of N6 and the gate of N4. The sources of N6 and N4 are grounded. The drain of N4 is connected to output terminal 17. PL1, P6, N6 and N4 function to mirror the current (IN1) flowing in N1 via the conduction path of N4 into or out of output 05. The output 02 is directly connected to the gate of P4 whose source is connected to Vdd and whose drain is connected to terminal 17.

The output 03 is directly connected to the gate of N5 whose source is grounded and whose drain is connected to output terminal 17. The output 04 is connected to the gate of N7 whose drain is connected to the gate and drain of P7 and to the gate of P5. The source of N7 is returned to ground and the sources of P7 and P5 are returned to Vdd. The drain of P5 is connected to terminal 17. The current (IP2) flowing in P2 and NL2 is mirrored via N7, P7 and the conduction path of P5 into or out of the output 05.

The bias circuit for current sources P3 and N3 includes a "diode" connected transistor P8 whose source is returned to Vdd and whose gate and drain are connected in common to the gate of P3 and via a resistor R1 to the drain of a transistor N9. The source of N9 is connected to the gate and drain of "diode" connected N8 and the gate of N3. The source of N8 is returned to ground. A power down (on/off control) signal is applied to the gate of N9. When the control signal applied to the gate of N9 is "low" there is no conduction in P8 and/or N8 whereby Vdd is applied to the gate of P3 and ground is applied to the gate of N3. P3 and N3 are then not conducting and the differential stages 11 and 13 are off and not operable.

The circuit of FIG. 1 is rendered operable when the control (Power Down) signal goes "high" turning on N9 and causing conduction in P8 and N8. The voltage drop across P8 is applied to the gate of P3 causing P3 to conduct as a relatively constant current source. In a similar manner, the voltage drop across N8 is applied to the gate of N3 causing N3 to conduct and function as a relatively constant current source.

In general, the operation of the circuit of FIG. 1 is such that when V1 is more positive than V2, transistors N4 and N5 are driven into a higher conductivity (lower impedance) condition and transistors P4 and P5 are driven into a lower conductivity (higher impedance) condition. It is significant that at least one of transistors N4 and N5 is driven such that the output 05 can be driven to, or close to, ground potential. On the other hand, when V1 is less positive than V2, transistors P4 and P5 are driven into a higher conductivity (lower impedance) condition and transistors N4 and N5 are driven into a lower conductivity (higher impedance) condition. It is significant that at least one of P4 and P5 is driven such that the output can be driven to, or close to, Vdd volts.

In general, differential amplifier stage 11, which includes differentially connected transistors N1 and N2 and load transistors PL1 and PL2, is operative for values of V1 and V2 which are more positive than an N-threshold voltage ($V_{TN}$) above the voltage at terminal 16, which in FIG. 1 is ground potential. When V1 and V2 are less than $V_{TN}$ volts above ground, N1 and N2 are non-conducting even if there is a difference between V1 and V2. For such values of V1 and V2, the output signals at 01 and 02 are at, or close to, $V_{DD}$ volts (or indeterminate). For values of V1 and V2 greater than $V_{TN}$ volts, differential amplifier stage 11 produces difference signals at outputs 01 and 02 which are a function of the amplitude of the difference between input signals V1 and V2. The output signals EO1 and EO2 produced at outputs 01 and 02 are used to drive the gates of IGFETS P4 and N4 which produce an output at terminal 17 which is proportional to the differential input (V1−V2) and which output can swing between $V_{DD}$ (the voltage at rail 18) and ground (the voltage at rail 16).

The differential amplifier stage 13, which includes differentially connected transistors P1 and P2 and load transistors NL1 and NL2, is inoperative for values of V1 and V2 which is between $V_{DD}$ volts and a P-threshold voltage ($V_{TP}$) of $V_{DD}$ volts. For such values of V1 and V2, the output signals EO3 and EO4 produced at outputs O1 and O2 are at, or close to, ground potential (or indeterminate).

For values of V1 and V2 which are less positive than $V_{TP}$ volts below $V_{DD}$ volts, differential amplifier 13 is operative. For these values of input signals (i.e. $V_{DD}-V_{TP}>V1$ and/or V2) transistors P1 and P2 produce differential signals EO3 and EO4, at outputs O3 and O4, which are representative of the differential input signals (V1−V2). EO3 and EO4 are in turn used to supply the potentials applied to the gates of P5 and N5 which produce an output at terminal 17 which is proportional to the differential input signal (V1−V2) and which output can swing between $V_{DD}$ and ground.

Thus: a) for a range of input signals (V1 and V2) lying between ground and $V_{TN}$ volts, differential amplifier stage 11 is inoperative while differential amplifier stage 13 is fully operative to produce an output signal reflective of the differential input signals.

b) for the range of input signals lying between $V_{TN}$ volts above ground and $V_{DD}-V_{TP}$ volts, differential amplifier stages 11 and 13 are both fully operative and their outputs are combined to produce an output reflective of the differential input signals.

c) for the range of input signals lying between $V_{DD}$ and $V_{DD}-V_{TP}$ volts, differential amplifier stage 13 is inoperative while differential amplifier stage 11 is fully operative to produce an output signal reflective of the differential input signals.

The outputs of differential stages 11 and 13 are combined via an "OR'ring" circuit (comprised of P4, P5, N4 and N5) which ensured the ability to produce rail-to-rail output signals for values of input signals ranging between the two rails. (i.e. Rail-to-Rail meaning voltage values ranging between the operating potentials applied to the comparator circuit.)

The operation of differential stages 11 and 13 and the OR'ing circuit of FIG. 1 will now be examined in greater detail for the condition of V1 going more positive than V2. The operation of the circuit will now be described with reference to FIG. 2.

1. It may be assumed that when V1 is equal to V2, the voltage EO1 at O1 is equal to the voltage EO2 at O2 and EO3 is equal to EO4. For V1=V2 and for V1 and V2 lying in a range such that V1 and V2 are one threshold ($V_{TN}$) above ground and are one threshold ($V_{TP}$) below $V_{DD}$, it may be assumed for use of explanation that EO1=EO2=EO3=EO4=$V_{DD}/2$. When V1 goes more positive than V2, EO1 goes negative relative to EO2 (e.g., goes from $V_{DD}/2$ volts towards ground). EO1 cannot go all the way to ground being held at a voltage which is offset from $V_{SS}$ by the drop across the source-drain of N3 ($V_{DS}$ of N3) and the drop across the source-drain of N1 ($V_{DS}$ of N1). However, the current (IN1) flowing in N1 is mirrored via P6 into N6 generating a voltage drop across the gate to source of N6 and N4 which causes a current, IN4, flowing in N4 to be sourced from output O5 via N4 to ground. [By ratioing the devices, IN4 may be equal to, greater than or less than IN1.] Thus, as V1 goes more and more positive, N4 can conduct more and more current, causing output O5 to be discharged to, or close to, ground potential.

2. Turn-on of N5: As V1 goes more and more positive relative to V2, P2 is turned off more and more, P1 is turned on more and more and the current flowing into NL1 increases more and more with the voltage at O3 increasing towards $V_{DD}$ until it reaches some value which is offset from $V_{DD}$ by the source-to-drain voltage drop across P3 ($V_{DS}$ of P3) and the source-to-drain voltage drop across P1 (VDS of P1). The output O3 is applied directly to N5, causing N5 to conduct more and more and drive output terminal 17 toward ground potential. Differential stages 11 and 13 work in tandem/parallel such that for V1>V2, the output O3 causes N5 to drive terminal 17 towards ground and the output O1 causes N4 to operate such that terminal 17 is driven towards ground potential.

3. Turn-off of P4: As V1 goes more and more positive relative to V2, EO2 goes positive relative to EO1 all the way to $V_{DD}$ volts. The O2 output is directly applied to the gate of P4 whose conductivity is inhibited more and more as EO2 goes more and more positive, so that P4 is fully turned off when EO2 rises above the $V_T$ of P4.

4. Turn-off of P5: As V1 goes more and more positive relative to V2, the voltage at O4 goes more and more negative towards ground potential, cutting off N7 and decreasing the current through P7 until P7 is no longer conductive. The current through P7 is mirrored via the conduction path of P5 into output O5. Thus, as O4 goes negative, P5 gets turned off more and more until it is no longer conductive. Consequently, the outputs of differential stages 11 and 13 are combined in OR'ing circuit 15 so that each contributes to provide gain and maintain a full output voltage swing.

Referring to FIG. 2 and for the condition of V1 going negative relative to V2, the operation of the circuit may be described as follows:

1. As V1 goes negative relative to V2, the voltage at O1 goes more and more positive towards $V_{DD}$ volts (less current is drawn via N1) until N1 is no longer conducting and the voltage at O1 goes toward $V_{DD}$ volts.

The current IN1 through N1 is mirrored via P6 and N6 to N4. For ease of description, it may be assumed that IN4 is equal to IN1. As IN1 goes to zero, so does IN4 and this causes N4 to be turned off and to present a very high impedance, essentially non-conductive, path between output O5 and ground.

2. Concurrently, O2 goes more and more negative but bottoms at a voltage above ground due to the voltage drop across N2 ($V_{DS}$N2) and the voltage drop, across N3 ($V_{DS}$N3). The voltage applied to the gate of P4 is such that the voltage at O2 is proportionally smaller than the voltage at O1.

3. As V1 goes more negative than V2, P2 conducts more and more than P1, until P2 is full on and P1 is turned off. As P1 turns off more and more less and less current flows via P1 onto output O3 and NL1 and the voltage at O3 goes more and more towards ground potential. As O3 drops below the $V_T$ of N5, the latter turns off. Thus, N5 and N4 are both rendered less and less conductive (their impedances are ever increasing) as V1 goes negative relative to V2.

4. Concurrently, output O4 is driven more and more positive towards $V_{DD}$ volts. However, EO4 cannot rise above $V_{DD}$ minus the offset due to the voltage drop across P3 and P2 (i.e. $V_{DS}$P3 + $V_{DS}$P2). However, the voltage at O4 is translated via the current mirror N7, P7 into P5. As EO4 becomes more and more positive, the current IP2 is mirrored via P7 and N7, causing a current, IP5 to flow via P5, which enables the output O5 to be charged up to $V_{DD}$ volts.

It has thus been shown that the outputs of the two differential stages can be combined via OR'ing network 15 to produce a single ended output which can virtually swing over the full operating voltage applied to supply lines 16 and 18.

The comparator of FIG. 1 is essentially a high gain differential input amplifier with a single-ended output. Since a comparator is switched between two output states, it is required to have a rapid recovery from either the saturation or cutoff states( a high slew rate). The voltage gain (output/input) is typically a minimum of 1000 (60-db), and is necessary only from the standpoint of reducing the differential input levels necessary to make the output swing from one extreme level to the other. Since the comparator operates under an open loop condition, it does not require frequency compensation.

The circuit of FIG. 1 incorporates two differential amplifier input stages [namely a P comparator (differential stage 13) in combination with an N comparator (differential stage 11)]to produce a combined amplifier stage which is responsive to an input voltage range that extends virtually from $V_{SS}$ to $V_{DD}$ supply rails (i.e. The most positive to the most negative operating voltage applied to the circuit). The outputs of the two comparators are combined by means of OR'ing the network outputs to assure a valid output signal for values of differential input signals approaching either supply rail. Thus, the circuit configuration includes a novel approach to combine the output functions of the two independent comparators. The resultant output function of this combination is effectively equivalent to a comparator whose differential inputs can be varied between the $V_{SS}$ to $V_{DD}$ supply limits and an output signal, whose output range can swing from $V_{SS}$ to $V_{DD}$ supply limits.

What is claimed is:

1. A comparator comprising:
   first and second differential amplifier stages, each stage having first and second signal inputs and first and second outputs;
   means for applying first and second input voltages to the first and second signal inputs of said first and second differential amplifier stages; and
   means for combining the outputs of the first and second differential amplifier stages including:
   a) first and second P-type IGFETS, having their conduction paths connected in parallel between a first point of operating potential and an output terminal;
   b) first and second N-type IGFETS, having their conduction paths connected in parallel between said output terminal and a second point of operating potential;
   c) means coupling the first and second outputs of said first differential amplifier stage to the gates of said first P-type IGFET and said first N-type IGFET; and
   d) means coupling the first and second outputs of said second differential amplifier stage to the gates of said second P-type IGFET and to the gate of said second N-type IGFET.

2. The comparator as claimed in claim 1. wherein said first differential amplifier stage includes active differentially connected transistors of one conductivity type connected to load transistors of opposite conductivity type; and
   wherein said second differential amplifier stage includes active differentially connected transistors of said opposite conductivity type connected to load transistors of said one conductivity type.

3. The comparator as claimed in claim 2, wherein said means coupling the first and second outputs of said first differential amplifier stage to the gates of said first P-type IGFET and said first N-type IGFET includes:
   a) means direct current connecting the first output of said first differential amplifier to the gate of said first P-type IGFET and
   b) means including a current mirror for coupling the second output of the first differential amplifier stage to the gate of said first N-type IGFET;
   and wherein said means coupling the first and second outputs of said second differential amplifier stage to the gates of said second P-type IGFET and said second N-type IGFET includes:
   a) means direct current connecting the first output of said second differential amplifier to the gate of said second P-type IGFET and
   b) means including a current mirror for coupling the second output of the second differential amplifier stage to the gate of said second N-type IGFET.

4. A comparator comprising:
   first and second power lines for the application thereto of a first voltage (VP1) and a second voltage (VP2) respectively; with VP1 being more positive than VP2;
   first and second differential amplifier stages, each stage having first and second signal input terminals, first and second signal output terminals and first and second power terminals;
   means for coupling the first and second power terminals of said first stage and the first and second power terminals of said second stage between said first power line and said second power line;
   means for applying the same differential input signals across the first and second signal input terminals of said first and second stages;
   said first stage being responsive to differential input signals ranging in value between VP1 and a first voltage level, which is $V_{T1}$ volts above VP2, for producing output signals which can swing fully between VP1 and VP2 as a function of the differential input signal;
   said second stage being responsive to differential input signals ranging in value between VP2 and a second voltage level, which is $V_{T2}$ volts below VP1, for producing output signals which an swing fully between VP1 and VP2 as a function of the differential input signal; where $V_{T1}$ and $V_{T2}$ are, respectively, first and second threshold voltages; and
   means for combining the output signals of said first and second stages for producing output signals which can swing between VP1 and VP2 for values of differential input signals which range between VP1 and VP2.

5. The comparator circuit as claimed in claim 4 wherein the first stage includes a pair of differentially connected transistors of N conductivity type and wherein the second stage includes a pair of differentially connected transistors of P-conductivity type.

6. The comparator circuit as claimed in claim 5, wherein the means for combining the output signals of said first and second stages includes:
   means coupling the first and second signal output terminals of the first stage to a first current sourcing transistor and to a first current sinking transistor;

the first current sourcing transistor having ga conduction path connected between the first power terminal of the first stage and a comparator output terminal and the first current sinking transistor having its conduction path connected between said comparator output terminal and the second power terminal of the first stage; and means coupling the first and second signal output terminals of the second stage to a second current sourcing transistor and a second current sinking transistor;

the second current sourcing transistor having a conduction path connected between the first power terminal of the second stage and said output terminal and the second current sinking transistor having a conduction path connected between said comparator output terminal and the second power terminal of the stage.

7. The comparator as claimed in claim 4, wherein the first stage includes:
a) first and second differentially connected insulated-gate field effect transistors (IGFETs) of N-conductivity type the first differentially connected N-type transistor having its gate connected tot he first signal input terminal of the first stage and its conduction path connected between the first signal output terminal of the first stage and a differential node of the first stage and the second differentially connected N-type transistor having its gate connected to the second signal input terminal of the first stage and its conduction path connected between the second signal output terminal of the first stage and the differential node of the first stage;
b) a relatively constant current source connected between the differential node of the first stage and said second power line; and
c) a first load transistor of P conductivity type having its conduction pat connected between the first output of the first stage and the first power line, and a second load transistor of P conductivity type having its conduction path connected between the second output of the first stage and the first power line; and wherein the second stage includes;
a) first and second differentially connected transistors of P-conductivity type, the first differentially connected P-type transistor having its gate connected to the first signal input terminal of the second stage and its conduction path connected between the first output terminal of the second stage and a differential node of the second stage and the second differentially connected P-type transistor having its gate connected to the second signal input terminal of the second stage and its conduction path connected between the second output terminal of the second stage and the differential node of the second stage;
b) a relatively constant current source connected between the differential node of the second stage and said first power line; and
c) a first load transistor of N-conductivity type having its conduction path connected between the first signal output terminal of the second stage and the second power line, and a second load transistor of N-conductivity type having its conduction path connected between the second signal output terminal of the second stage and the first power line.

8. The comparator as claimed in claim 7, wherein said means for combining the output signals of said first and second stages includes:
first and second combining insulated-gate field-effect transistors (IGFETs) of P conductivity having their conduction paths connected in parallel between said first power line and a comparator output terminal;
third and fourth combining IGFETs of N-conductivity type having their conduction paths connected in parallel between said comparator output terminal and said second power line;
first means coupling the gate of said first combining IGFET to the first signal output terminal of said second stage;
second means coupling the gate of said third combining IGFET IGFET to the first signal output terminal of said second stage;
third means coupling the gate of said third combining IGFET to the second signal output terminal of said first stage; and to the second signal output terminal of said first stage; and
fourth means coupling the gate of said fourth combining IGFET to the second signal output terminal of said second stage.

9. The comparator as claimed in claim 8, wherein the third means includes current mirror means for translating the signal at said second signal output terminal of said first stage to the gate of said third combining IGFET; and wherein the second means includes current mirror means for translating the signal at said first signal output terminal of said second stage to the gate of said second combining IGFET.

* * * * *